US010027338B2

(12) United States Patent
Dempsey et al.

(10) Patent No.: US 10,027,338 B2
(45) Date of Patent: Jul. 17, 2018

(54) BUFFER, AND DIGITAL TO ANALOG CONVERTER IN COMBINATION WITH A BUFFER

(71) Applicant: Analog Devices Global, Hamilton (BM)

(72) Inventors: Dennis A. Dempsey, Newport (IE); Harvey T. Mercado, Dasmarinas (PH)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/618,620

(22) Filed: Jun. 9, 2017

(65) Prior Publication Data
US 2017/0359077 A1 Dec. 14, 2017

Related U.S. Application Data

(60) Provisional application No. 62/351,393, filed on Jun. 17, 2016, provisional application No. 62/348,746, filed on Jun. 10, 2016.

(51) Int. Cl.
*H03M 1/06* (2006.01)
*H03M 1/08* (2006.01)

(52) U.S. Cl.
CPC .................................... *H03M 1/08* (2013.01)

(58) Field of Classification Search
CPC ........................................................ H03M 1/08
USPC .................................................. 341/118–144
See application file for complete search history.

(56) References Cited

U.S. PATENT DOCUMENTS

| 6,066,986 | A | * | 5/2000 | Chao | .................... | H03F 3/45479 |
| | | | | | | 330/261 |
| 6,081,751 | A | | 5/2000 | Luo et al. | | |
| 6,181,263 | B1 | * | 1/2001 | Malik | .................... | H03M 1/06 |
| | | | | | | 341/118 |
| 7,355,536 | B2 | | 4/2008 | Dempsey et al. | | |
| 7,450,044 | B2 | | 11/2008 | Moore et al. | | |
| 8,063,805 | B1 | * | 11/2011 | Eid | ......................... | G05F 1/56 |
| | | | | | | 341/142 |
| 8,456,338 | B2 | | 6/2013 | Regier et al. | | |
| 8,604,765 | B2 | | 12/2013 | Regier et al. | | |
| 8,884,573 | B2 | | 11/2014 | Lyden et al. | | |
| 9,330,734 | B2 | * | 5/2016 | Mozak | ................... | G11O 5/147 |
| 9,407,278 | B1 | * | 8/2016 | Dempsey | ............... | H03M 1/66 |
| 2005/0285674 | A1 | * | 12/2005 | Zaguri | ............... | H03F 3/45183 |
| | | | | | | 330/254 |

(Continued)

OTHER PUBLICATIONS

Amir Zjajo et al. *A Low-Power Digitally-Programmable Variable Gain Amplifier in 65 nm CMOS*, Conference Paper, Jan. 2010, 7 pages.

(Continued)

*Primary Examiner* — Lam T Mai
(74) *Attorney, Agent, or Firm* — Patent Capital Group

(57) ABSTRACT

A buffer is provided where a part of the buffer is implemented in switched capacitor or other analog discrete time processing circuitry and a dynamic response characteristic, such as an effective gain or charge transfer coefficient between the input stage and an output stage is digitally controllable. This means that the buffer can be driven as if it was a system controlled by, for example a three (3) term controller, giving rise to greater, digital flexibility in tailoring the buffer's transient response.

24 Claims, 14 Drawing Sheets

(56) References Cited

U.S. PATENT DOCUMENTS

| | | | |
|---|---|---|---|
| 2008/0278200 A1* | 11/2008 | Chiu | H03M 1/661 |
| | | | 327/103 |
| 2009/0302922 A1* | 12/2009 | Kibune | H03K 19/0175 |
| | | | 327/306 |
| 2014/0292249 A1 | 10/2014 | Lyden et al. | |
| 2015/0061769 A1 | 3/2015 | Bodnar et al. | |
| 2017/0359079 A1 | 12/2017 | Dempsey | |

OTHER PUBLICATIONS

M. Degrauwe et al., *A Microwave CMOS-Instrumentation Amplifier*, IEEE Journal of Solid-State Circuits, vol. SC-20, No. 3, Jun. 1985, 3 pages.

Notice of Allowance issued in U.S. Appl. No. 15/618,392 dated Dec. 26, 2017, 10 pages.

* cited by examiner

BUFFER, AND DIGITAL TO ANALOG CONVERTER IN COMBINATION WITH A BUFFER

PRIORITY DATA AND RELATED APPLICATIONS

This Non-Provisional Patent Application claims priority to and/or receives benefit from U.S. Provisional Patent Application having Ser. No. 62/348,746 filed on Jun. 10, 2016 entitled "DIGITAL TO ANALOG CONVERTER INCLUDING LOGICAL ASSISTANCE", and U.S. Provisional Patent Application having Ser. No. 62/351,393 filed on Jun. 17, 2016 entitled "BUFFER AND DIGITAL TO ANALOG CONVERTER IN COMBINATION WITH A BUFFER". Both US Provisional Patent Applications are hereby incorporated by reference in their entirety. A co-pending U.S. Non-Provisional Patent Application having Ser. No. 15/618,392 filed on Jun. 9, 2017 entitled "DIGITAL TO ANALOG CONVERTER INCLUDING LOGICAL ASSISTANCE" is also hereby incorporated by reference in its entirety.

TECHNICAL FIELD OF THE DISCLOSURE

The present disclosure relates to a buffer, and to a digital to analog converter in combination with such a buffer. The digital to analog converter may include a transition controller.

BACKGROUND

Digital to analog converters (DACs) find utility in a great many devices. They can be found in audio and video systems, and within motor control and industrial control systems. Automotive, aerospace, instrumentation and sensor actuation and healthcare sectors are also users of large numbers of DACs.

Motor control systems can range from the very large where, for example, massive machines such as cranes and lifting gear are controlled by signals output by a DAC, to the very small where, for example, auto-focus functions in cameras or other small scale actuators or micro-machines are controlled by a DAC.

Sometimes the processing systems providing input words to the digital to analog converter are themselves relatively modest in their capability or are highly tasked such that they do not have the spare capacity to reliable take on updating the DAC at a higher rate. It would therefore be advantageous to include some form of flexibility within (i.e., as part of) the DAC which enabled its output, and in particular the shape of transitions at the output of the DAC to be controlled without requiring further intervention by the system providing input words to the DAC.

BRIEF SUMMARY OF THE DISCLOSURE

According to a first aspect of this disclosure there is provided a buffer amplifier, wherein the amplifier comprises a discrete time signal processing system and wherein the dynamic signal response characteristic of the buffer amplifier is adjustable by way of a controllable component associated with the buffer amplifier.

Preferably the internal gain of the buffer amplifier is adjustable. Generally, buffer amplifiers are continuous linear time invariant analog devices provided with a feedback loop. However, it is also known in some instances (generally in association with sensors and analog to digital converters) to use chopping amplifiers as these can give superior DC offset performance (more strictly reduced input referred offset), albeit with the risk of additional disturbance around the chopping frequency and increased power consumption may be required as the internal nodes of the amplifier undergo a transition at each switching event of the input and output choppers. However, the actual transfer characteristic of the amplifier bounded by the chopping switches is continuous linear time invariant. By contrast, the present disclosure discloses using a buffer with a time varying transfer characteristic and also a buffer which is not a continuous time device. A switched, auto-zero amplifier technique may also be used to improve amplifier precision, see for example "A Micropower CMOS-Instrumentation Amplifier, M. Degrauwe; E. Vittoz; I. Verbauwhede, IEEE Journal of Solid-State Circuits, Year: 1985, Volume: 20, Issue: 3".

The gain of the amplifier can also be adjusted by external components.

The use of discrete time signal processing within the analog domain, i.e., by switched capacitor techniques, allows offset and noise performance of the buffer to be controlled. Furthermore, the use of an adjustable/controllable impedance, for example a controllable capacitance enables the internal gain of the buffer amplifier to be adjusted. This, in turn, may cause an adjustment of the output stage small signal bandwidth of the amplifier and/or the large signal slew rate of the amplifier. Gain can also be varied by controlling the transconductance of the amplifier or its load impedance. Similarly, the amplifier bandwidth may be varied by controlling the transconductance or load capacitance.

According to a second aspect of the present disclosure there is provided a DAC in combination with a buffer amplifier according to the first aspect of this disclosure.

In some embodiments of this disclosure the DAC and the buffer amplifier may share components giving rise to a design where a high degree of component matching can be achieved. Techniques such as dynamic element matching and calibration (including trimming) can also be used.

According to a third aspect of this disclosure there is provided a DAC and buffer amplifier combination, wherein a controller responsive to a DAC input word is arranged to adjust a gain within a discrete time signal processor implemented in a signal processing path between the DAC and an operational amplifier constituting an output stage of the buffer amplifier, wherein the discrete time signal processor comprises at least one capacitor and switches associated with the at least one capacitor for controlling the connections to the at least one capacitor for storing a charge representing a voltage difference between first and second nodes, and transferring the charge, in whole or in part, to an integrator.

According to a further aspect of the present disclosure there is provided a method of modifying a voltage transition from the first value to a second value at an output of a buffer amplifier, and wherein parameters of the buffer amplifier are controlled by controllable components comprising one or more capacitors, resistors, or transconductors within or coupled to the amplifier and the values of the controllable components are adjustable to provide a non-linear response of the amplifier.

According to a further aspect of this disclosure there is provided a DAC in combination with a buffer where the response of the buffer is dynamically adjustable by controlling a capacitance or a resistance associated with the buffer.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Figure 1:
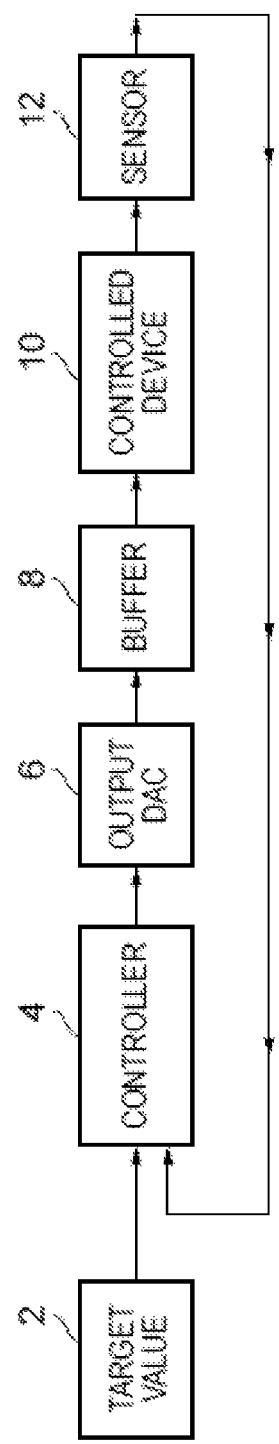
FIG. 1 is a schematic diagram of a control loop for a controlled device, wherein an output of a digital controller is converted from a digital to analog domain by a DAC and provided to the controlled device by way of a buffer.

DACs find use in many applications. They are often found within the output stages of audio and video systems, but can also be used to control myriads of other systems, such as control of amplifiers, actuation of motors and/or sensors, and a whole host of other uses. FIG. 1 schematically illustrates a controlled system including a DAC. As shown in FIG. 1, a first device 2, such as a digital processor or state machine, may define a target value for a controlled device. That target value may be static or may vary as a function of time or other system variables, such as pressure, temperature, current, frequency, image quality/focus and so on. For example devices (such as sensors or actuators) may be periodically monitored to see if an update to drive signals or the like are required. Monitoring and/or control subsystems may be powered down between the monitoring operations to conserve power. Thus updates may only occur periodically or occasionally. In some systems, such as electromechanical systems with relatively long setting times, it can be beneficial to use augmented functionality within the DAC or an analog signal processing chain downstream of the DAC to mitigate some of the less desirable characteristics of the electromechanical system.

The target value can be supplied to a controller 4 which, for the purposes of this disclosure will be assumed to be implemented within the digital domain. The controller may implement one or more of several known control strategies depending on the task to be achieved and the status of the system being controlled. Thus control strategies may include implementing proportional control, derivative control, integral control, and combinations of one or more of preceding control strategies, where the parameters of the controller may either be predetermined or adaptive. Furthermore the controller may implement other control strategies, such as a rule based fuzzy logic control, an expert system control, a neural network control algorithm, a genetic control algorithm, or other hybrids of these various control designs. However once the controller has performed a calculation to set the next value to be provided to the control device, the controller outputs a signal which is converted from the digital domain to the analog domain by a DAC 6. It will be appreciated that constructional or implementation details of the DAC and specific timing and control strategies of the controller or DAC have been omitted for clarity.

The DAC 6 is generally selected for criteria such as speed, linearity, noise performance, settling time and so on and many manufacturers of such devices tend to favor low power devices, with the knowledge that the output from the DAC 6 can be modified by a suitable buffer 8 in order to provide the necessary voltage or current to drive the controlled device 10, either directly, or by way of further analog circuits or devices. The response of the controlled device 10 is often monitored by one or more sensors, designated 12 whose outputs can be returned to the controller. The controller can accept an analog feedback signal from the sensor and digitize it itself, or the sensor may include an analog to digital converter such that communication from the sensor to the controller is performed within the digital domain. The feedback signal may be direct or indirect. For example, if the controlled device is an electric actuator whose position is to be controlled, then a position sensor may be provided to give direct feedback of actuator position and actuator speed. However, if the actuator is provided as part of a larger system, say for example a camera auto-focus system, then actuator position is indirectly encoded by whether the image is focused or not. In such an arrangement feedback to the controller 4 may be indirect, for example from the back electromotive force (EMF) from a motor coil. The controller 4, DAC 6, buffer 8 and controlled device 10 may be operated in a local open loop manner with, potentially, a different and more remote feedback loop providing overall control. For example, if the system in FIG. 1 is included within an auto-focus system the target value may be modified by the auto-focus system providing a closed loop at a higher level within the overall system. The controlled device could be many things, such as a circuit node, a passive load, an electrochemical cell or one terminal of an electrochemical cell and so on.

The control loop shown in FIG. 1 may be part of a further and larger control loop within a more complex system. For example, if the control device was a voice coil motor controlling the position of a lens adjacent an image capture array then an auto-focus system may provide the target value of the system shown in FIG. 1 in order to move the lens to an appropriate position. The target value may itself vary as a function of time as the auto-focus system refines its estimate of where the lens should be placed in order to focus an image correctly onto the image collecting array of photo detectors. Furthermore, the target value may be set as one of a series of steps implemented as part of a resonance control algorithm which seeks to move the lens from an initial position to an end position as quickly as possible in order to focus the camera whilst also reducing the settling time of the control device if, for example, if the control device constitutes a mechanical resonance system which itself is underdamped.

As noted earlier the controller 4 can receive a target value and the measured response of the controlled device and it can implement various control strategies based on that difference. A well-known and classical control strategy is a PID, or a three (3) term controller. Variants of such control systems have been extensively studied for the control of actuator based mechanical and electromechanical systems.

Figure 2:
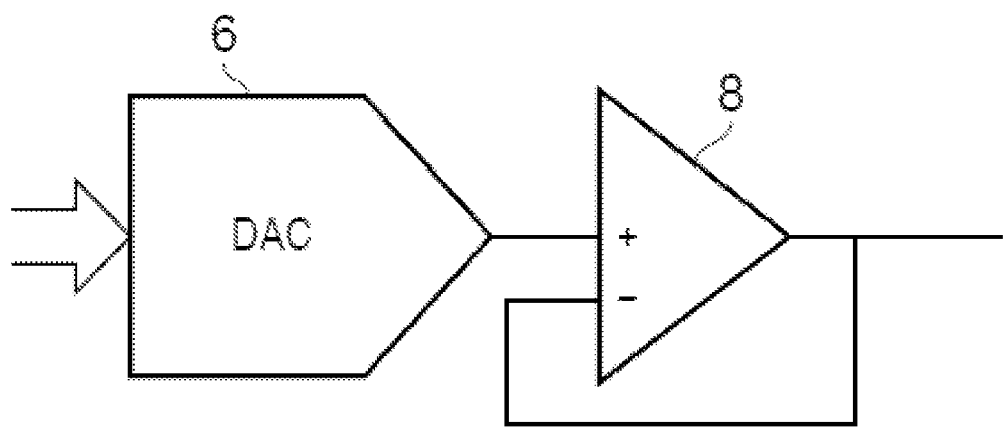
FIG. 2 schematically shows the circuit of the digital to analog controller and the buffer in greater detail.

FIG. 2 focuses on the configuration of the DAC 6 and the buffer 8 in greater detail. In FIG. 1 the buffer was shown as a functional block receiving an input signal and outputting an output signal. However, as shown in FIG. 2 it can be seen that the buffer itself uses a feedback loop. The arrangement shown in FIG. 2 is a unity gain non-inverting amplifier configuration as known to the person skilled in the art. A unity gain buffer configuration is often chosen as it should exhibit a faster response, and give rise to lower offset than any other of the possible buffer amplifier configurations. It does, however, mean that the DAC can be presented with a high impedance load, and that the buffer amplifier 8 can drive a low impedance load and that the voltage at the output of the buffer should match the voltage at the output of the DAC 6.

Figure 3:
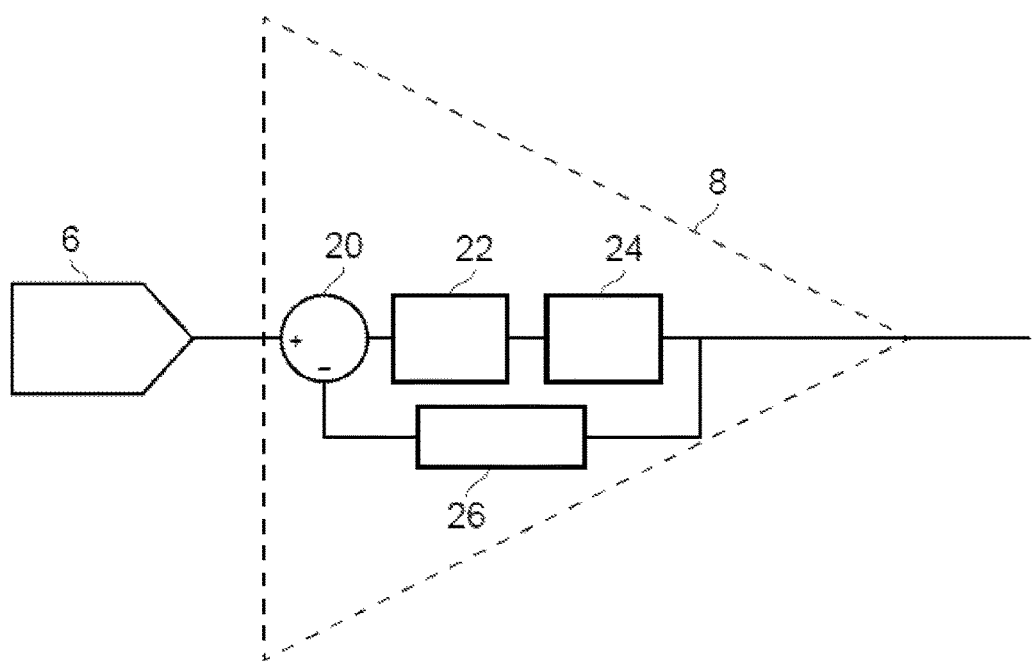
FIG. 3 is a diagram illustrating an insight by the inventors that the buffer amplifier could itself be regarded as a controller and a controlled device.

FIG. 3 schematically expands the components within the buffer amplifier 8 (buffer, buffer amplifier, and amplifier are sometimes used interchangeably herein) in a generalized form often adopted by control engineers. The buffer 8 receives an input signal from the DAC 6 at a non-inverting input of a summer 20. An output of a summer 20 is provided to a controller 22 whose output is provided to a system to be controlled, which can be regarded at the output stage 24 of the buffer 8, and the output of that system that is monitored by a feedback system 26, which could be a potential divider or in the case of a unity gain buffer is a connection back from the output of the amplifier to the inverting input thereof, which here is represented by the inverting input of the summer 20. The summer 20 effectively forms a difference signal and this function is analogous in a discrete time system to the "D" part of the PID controller. The controller 22 implements gain, which is analogous to the "P" part of a PID controller, and the output stage 24 represents the controlled system. Additionally, it is known that in order to allow the amplifier to be stable in a closed loop configuration the amplifier often includes a compensation capacitor formed within one of its stages which effectively has an integrating function. Thus, the controller 22 or the output stage 24 by virtue of having limited bandwidth and hence a low pass type transfer function (although this may be at an extremely high frequency) also implements an integrator being analogous to the "I" part of the PID controller. From this observation the amplifier 8 shown in FIG. 3 can be redrawn as shown in FIG. 4 where the numeric function associated and assigned to each stage, e.g., 20, 22 and 24 in FIG. 3, has been shown more explicitly in FIG. 4.

The insight was to realize that the buffer amplifier within, for example, a feedback loop could itself be regarded as being a controller, for example a three term controller rather than a linear component and that this gives rise to the possibility of modifying the performance of the control system within the amplifier 8. It also gives rise to the realization that the functionality of the control system within the amplifier, as illustrated in FIG. 4 can itself be split between continuous time processing and discontinuous time processing thereby enabling mixed signal techniques to be implemented using analog style components within a primarily analog circuit. This can be regarded as being a hybrid or mixed signal system. Mixed signal techniques such as switched capacitor circuits are known to the person skilled in the art.

Figure 4:
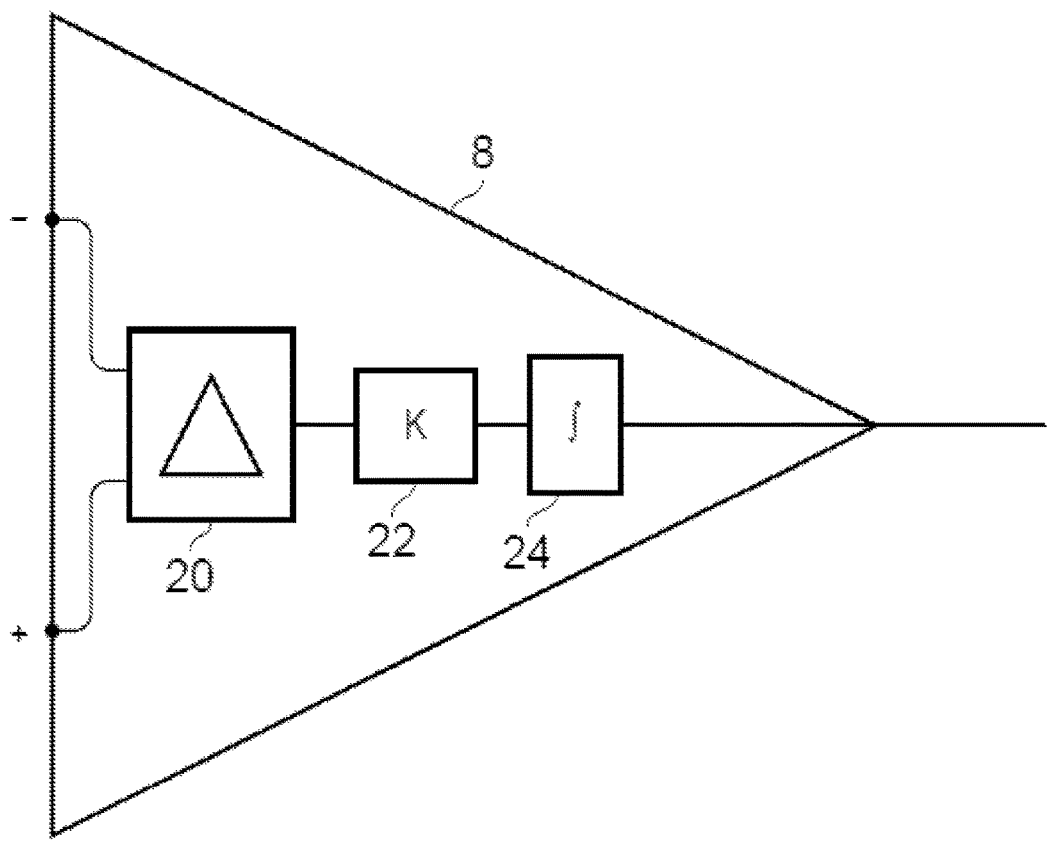
FIG. 4 is a diagram schematically representing the components of an operational amplifier in terms of proportional, integral and difference terms, where a difference with respect to time is equivalent to a derivative in a discrete time system, for the purposes of linking the operation of the operational amplifier with the performance of a proportional-integral-derivative (PID) controller.
Figure 5:
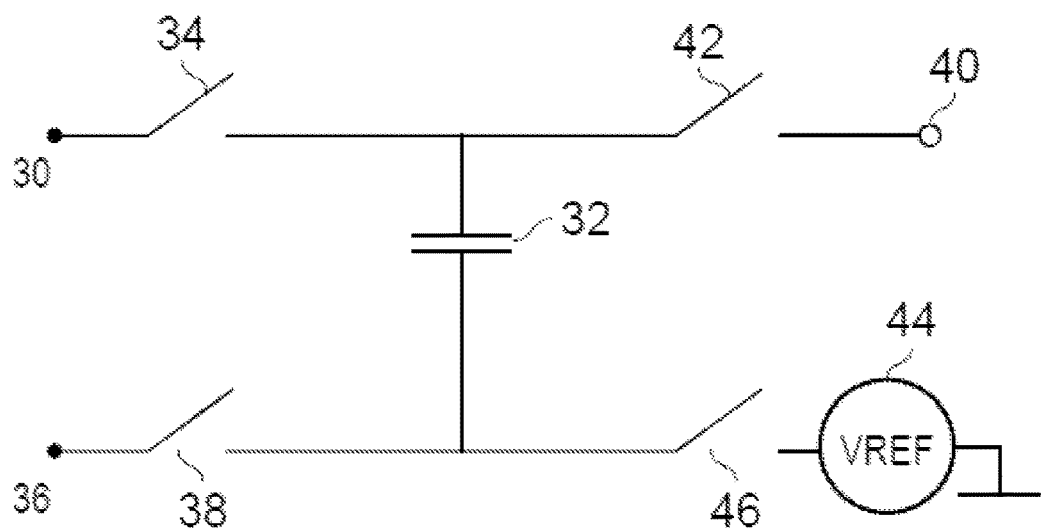
FIG. 5 is a schematic representation of a circuit operable to form the difference of voltages at first and second inputs in a discrete time manner.

FIG. 5 schematically illustrates a discontinuous time processing circuit implementing the differencing/derivative function identified with the summer 20 in FIGS. 3 and 4 which itself performs a discrete time version of the input stage of a conventional operational amplifier which, as known to the person skilled in the art, forms a difference between the voltages at its inverting and non-inverting inputs. In one embodiment a first input node 30 can be connected to the first plate of a sampling capacitor 32 by way of a first input switch 34. Similarly, a second input node 36 can be connected to a second plate of the sampling capacitor 32 by way of a second input switch 38. Thus, if switches 34 and 38 are closed and the voltages at first and second input nodes 30 and 36, are presented across the sampling capacitor 32 and it stores a charge which represents the difference between the voltages at the first and second input nodes 30 and 36. Once the switches 34 and 38 are opened this charge is held on the sampling capacitor 32. The sampling capacitor 32 can be connected to an output node 40 by way of a first output switch 42. The second plate of the sampling capacitor 32 can be connected to a reference voltage, here represented by voltage generator 44 by way of a further switch 46. The reference voltage generator could include the case where the reference voltage is itself the ground rail or one of the supply rails of the circuit. Thus an explicit and additional voltage reference generator circuit is not itself a necessity. If switches 42 and 46 are closed and the switch 46 connects the second plate of the capacitor to a zero volt line, then the voltage at the output node 40 represents the difference in voltage between the first and second input nodes 30 and 36. It can therefore be seen that forming a voltage difference between the input nodes, and moving it or translating it to a different voltage for subsequent processing is relatively easy using switch capacitor techniques.

Figure 6:
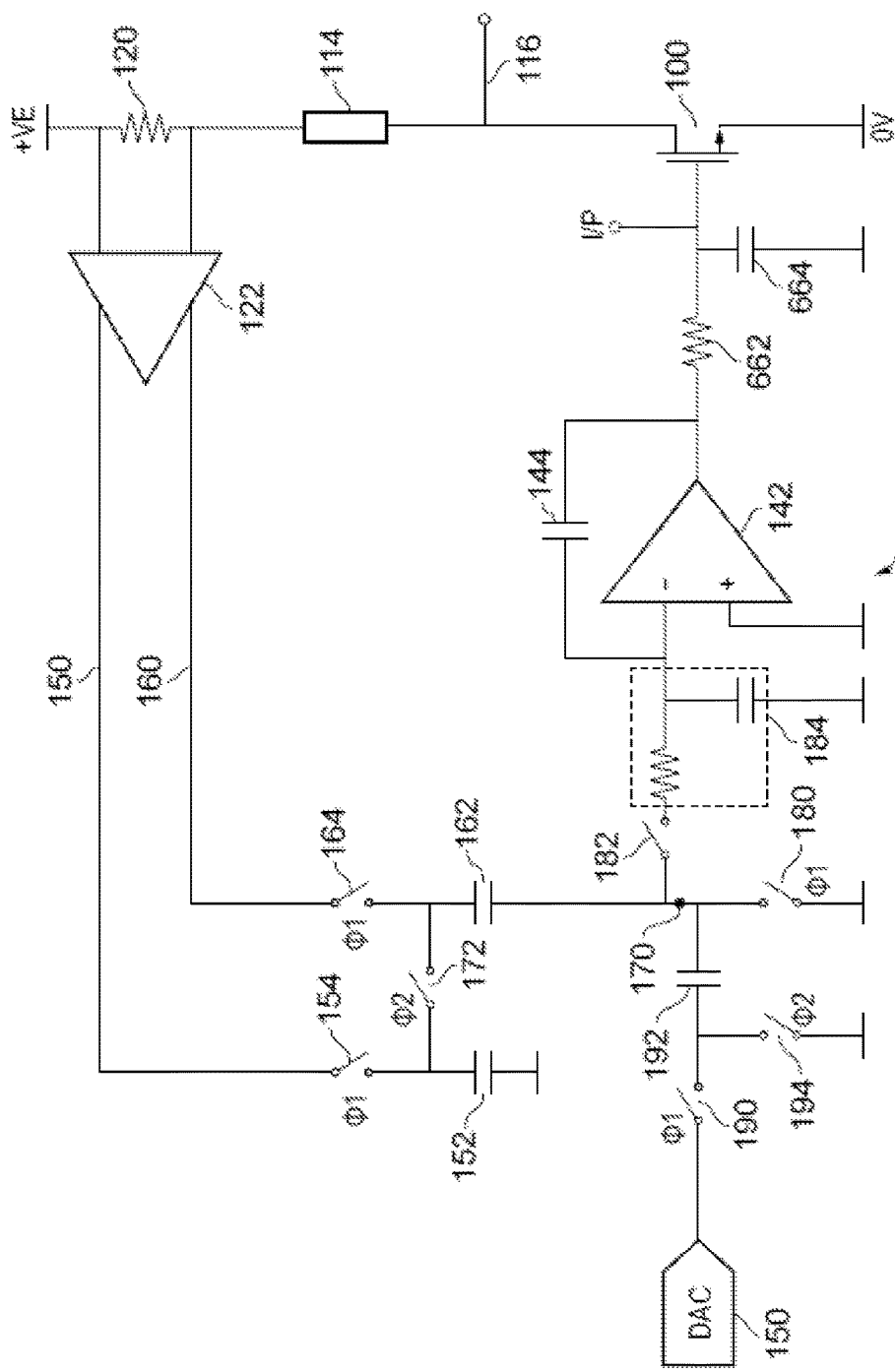
FIG. 6 is a circuit diagram for illustrating differences between the teachings of the present disclosure and the circuit shown in FIG. 6.

FIG. 6 shows a discontinuous close loop control system. Transistor 100 acts as an radio frequency (RF) amplifier, and the gain of the transistor is set by controlling the quiescent current through the transistor which in turn is controlled by the gate to source voltage of the transistor. This current and hence gain can be measured by determining the quiescent current flowing through the transistor. As shown in FIG. 6, the voltage across a resistor 120 which senses the current is buffered by an amplifier 122 and then selectively sampled onto capacitors 152 and 162. When switch 172 is closed the capacitors 152 and 162 become connected together and engage in charge sharing such that voltage at node 170 represents a difference in voltage across the resistor 120.

This charge can further be summed with a charge which was supplied from a DAC to capacitor 192 by way of switches 190 and 180. Thus, the difference between an input signal and a feedback signal is formed it can then be supplied by way of switch 182 to an integrator formed by a capacitor designated 144 around an operational amplifier 142. The output of the operational amplifier is filtered by a low pass filter comprising resistor 662 and capacitor 664 and then provided to the gate of the transistor.

When determining the difference between the present disclosure and other systems, the present disclosure includes the feature of a controllable internal gain that other systems do not.

Figure 7:
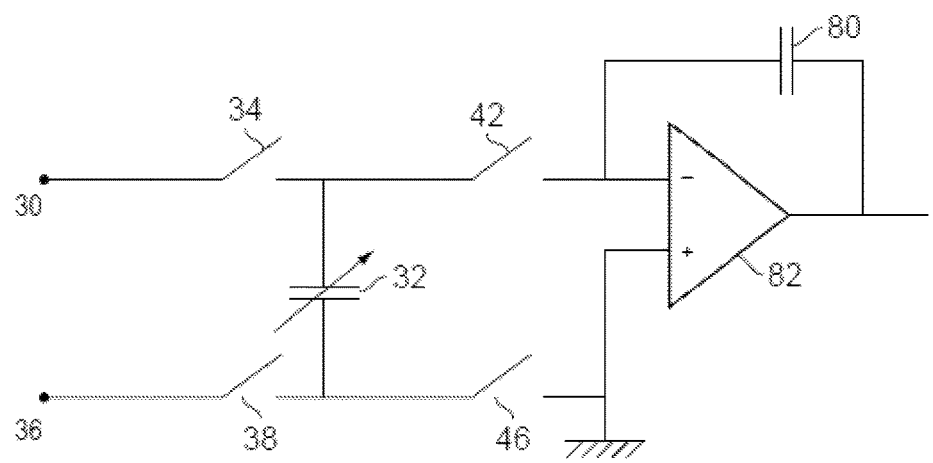
FIG. 7 is a circuit diagram showing the components within a buffer constituting an embodiment of the present disclosure.

The controllable internal gain can be configured by the mixed signal components. For example in an embodiment of the present disclosure the internal gain is set by determining the relative sizes of the sampling capacitor 32 and the output stage or feedback capacitor 80, shown in FIG. 7. The sampling capacitor 32 may be formed as an array of capacitors such that one or more of the capacitors in that array can be selected to be placed in parallel with each other to form an effective sampling capacitor which can then be connected between the first and second input nodes 30 and 36 by way of the switches 34 and 38. The amount of charge stored on the sampling capacitor 32 depends on its capacitance. However all of this charge is transferred to the output stage or feedback capacitor 80 connected between the output of the operational amplifier 82 and its inverting input. The ratio between the sampling capacitor 32 and the output stage or feedback capacitor 80 effectively sets a gain between the input stage and the output stage. By making the size of the input capacitor variable the effective gain of the circuit also becomes variable.

It can be seen that the equivalent effect could, in theory, be achieved by making the output stage capacitor or feedback capacitor 80 variable, although this may also give rise to glitches as and when capacitors were switched back in to the output stage or feedback capacitor 80 to provide variable capacitance, and the charge had to be delivered or removed from them by way of the operational amplifier 82. In general, any of the switches may be formed in association with a series resistor in order to limit perturbations caused by transient current flows when the switches are closed.

In use, once the sampling capacitor 32 has become charged switches 34 and 38 are opened. Switch 46 can then be closed and then charge transfer initiated once switch 42 is closed. Charge transfer between the sampling capacitor 32 and output stage or feedback capacitor 80 happens almost instantaneously. However because the operational amplifier 82 would be bandwidth and/or slew rate limited there becomes the possibility that following closure of switch 42, the voltage at the non-inverting input no longer matches that of the inverting input, this forces the amplifier to change its output voltage as fast as possible until such time as it manages to reestablish a suitable output voltage such that the potentials at the inverting and non-inverting inputs tend towards one another, subject potentially to a small amount of offset. If the amplifier has to change its output voltage by a substantial amount, it becomes conceivable to give the amplifier 82 a bit of a "kick" by setting the value of the sampling capacitor 32 to be relatively large during the sampling phase and during an initial period of time after closing the switch 42, but optionally to switch capacitors out of the array of capacitors forming the sampling capacitor 32 so as to reduce its capacitance as the amplifier is transitioning towards its final value. Thus, the transition speed and frequency content of the signals at the output of the amplifier can be adjusted during the transition between an initial value and a final value of a transition. The transition may itself include several DAC output samples/changes. Towards a later phase of the settling process capacitors might be added back in to the bank of capacitors forming the sampling capacitor 32 so as to reduce the apparent noise across the system.

It can be seen that the DAC output buffer can have its performance modified in order to prepare it to deal with a large change in output voltage in response to a word being processed by the DAC. By varying the value of the capacitance participating in the charge transfer process with the output stage or feedback capacitor 80, the effective internal transfer gain and effective internal time constants of the output buffer circuits as synthesized by the operational amplifier 82 in combination with the sampling capacitor 32 and output stage or feedback capacitor 80 in their respective switches means that the transfer function of the amplifier can be varied to give a non-linear and dynamically changing transfer function. This is in contrast with some other systems where the transfer function around the switch capacitor circuit and integrator is linear and time invariant.

The size of the capacitor participating in the differencing and charge transfer schemes can be varied under the control of a controller so as to implement one of several control schemes. As such the size of the capacitance might be selected in an expert system style of control based on the size of the transition output by, or about to be output by, the DAC.

Figure 8:
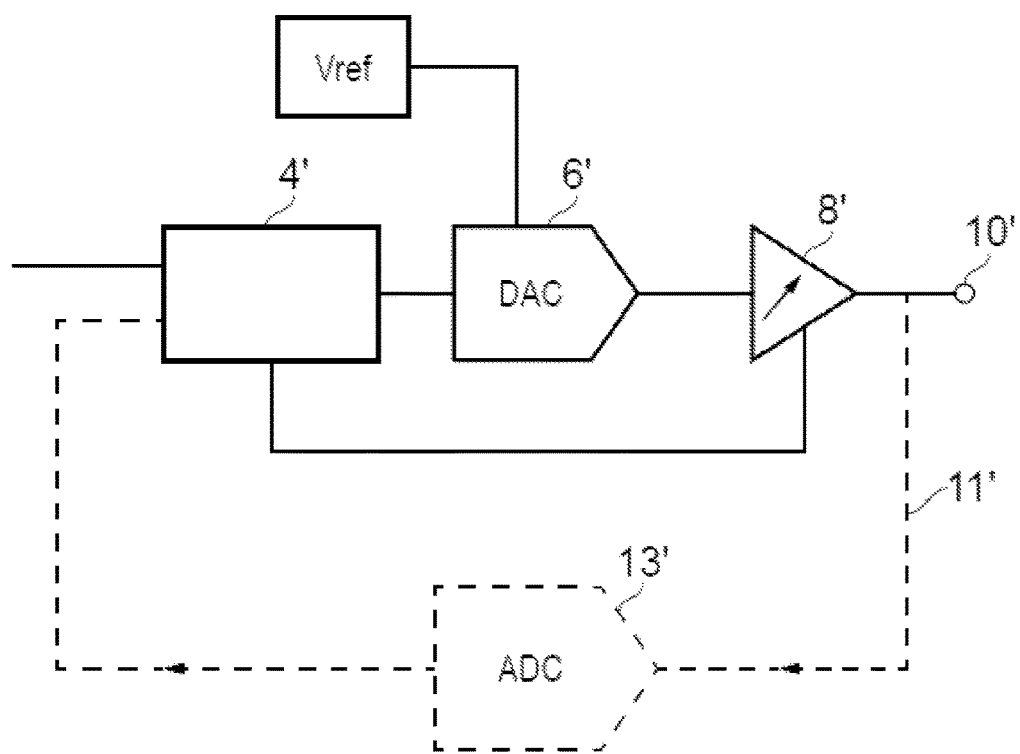
FIG. 8 is a schematic diagram showing an embodiment of the present disclosure.

FIG. 8 schematically illustrates a combination of a controller 4', DAC 6' and buffer 8' in accordance with the teachings of this disclosure. The controller 4' has a direct connection to control parameters of the buffer 8', unlike some other systems. For completeness, FIG. 7 also shows the voltage reference Vref that supplies a steady voltage to the DAC 6'. The output of the buffer is connected to a node 10' to which a load, actuator, motor, some other circuit, heater, electrochemical cell, and so may be connected. A feedback path 11' represented in chain outline may optionally be provided if the controller 4' is to operate in a closed loop mode as opposed to an open loop mode. The feedback path 11' may include an analog to digital converter 13', although one might be included within the controller 4'.

Figure 9:
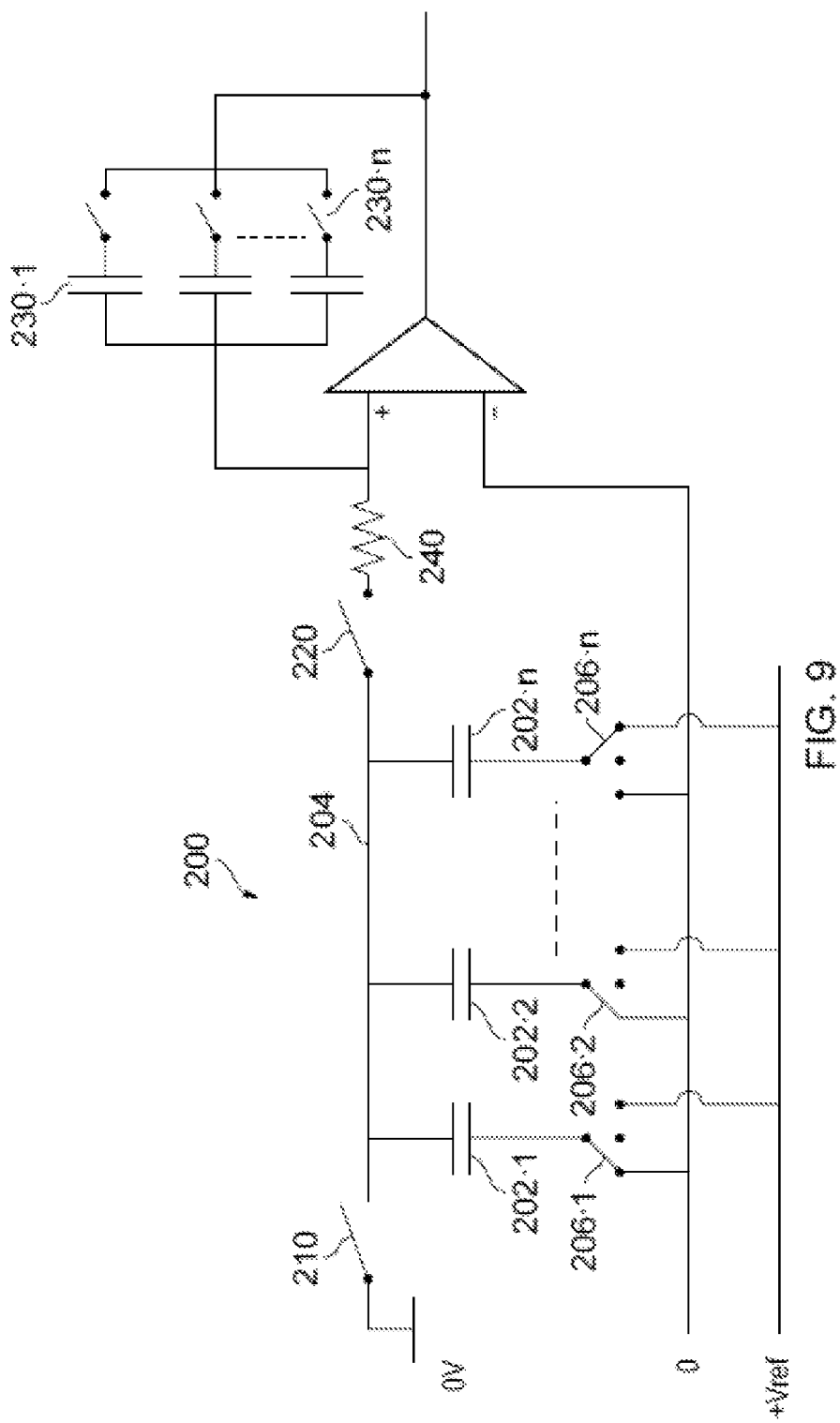
FIG. 9 is a circuit diagram showing an alternative embodiment of a buffer in accordance with the teachings of the present disclosure.

In a further variation as shown in FIG. 9 the DAC may be implemented as a switched array of capacitors 200. Here a plurality of capacitors 202.1 to 202.n have their top plates (as illustrated in FIG. 9) connected to shared conductor 204 and their bottom plates (with FIG. 9 in its correct orientation) can be connected by respective transistor switches 206.1 to 206.n to either of first and second reference voltages, which for simplicity will be regarded as zero (0) and +Vref.

The top plates can be selectively connected to 0 (or some other voltage reference) by way of a reset switch 210. In use all of the capacitors 202.1 to 202.n can be reset by closing reset switch 210 and connecting all their bottom plates to 0V. Reset switch 210 can then be opened. If one of more of the bottom plates are connected to +Vref in response to a digital word used to control the switches 206.1 to 206.n then charge sharing occurs and the array of capacitors act as so as to achieve a shared top plate voltage which is a function of the digital word. Thus they act as a DAC.

The switches 202.1 to 202.n may be operable to place one or more of them in a high impedance state, thereby allowing the number of capacitor from the array of capacitors 200 which go on to participate in a charge transfer with the output stage capacitance when switch 220 is closed to be controlled. Additionally or alternatively the output stage capacitor may also be fabricated from switched capacitors 230.1 to 230.n to control the value of that capacitor. By suitable selection of capacitors in the charge transfer stage and/or selection of the capacitors participating in the output stage capacitance a wide variety of dynamic/AC transfer functions can be imparted into the DAC and buffer combination illustrated in FIG. 9. A resistance 240 (which may be provided by the "on" resistance of, for example, a field effect transistor forming the switch) or may be provided as a further component limits in-rush transients when the switch 220 is closed.

Figure 10:
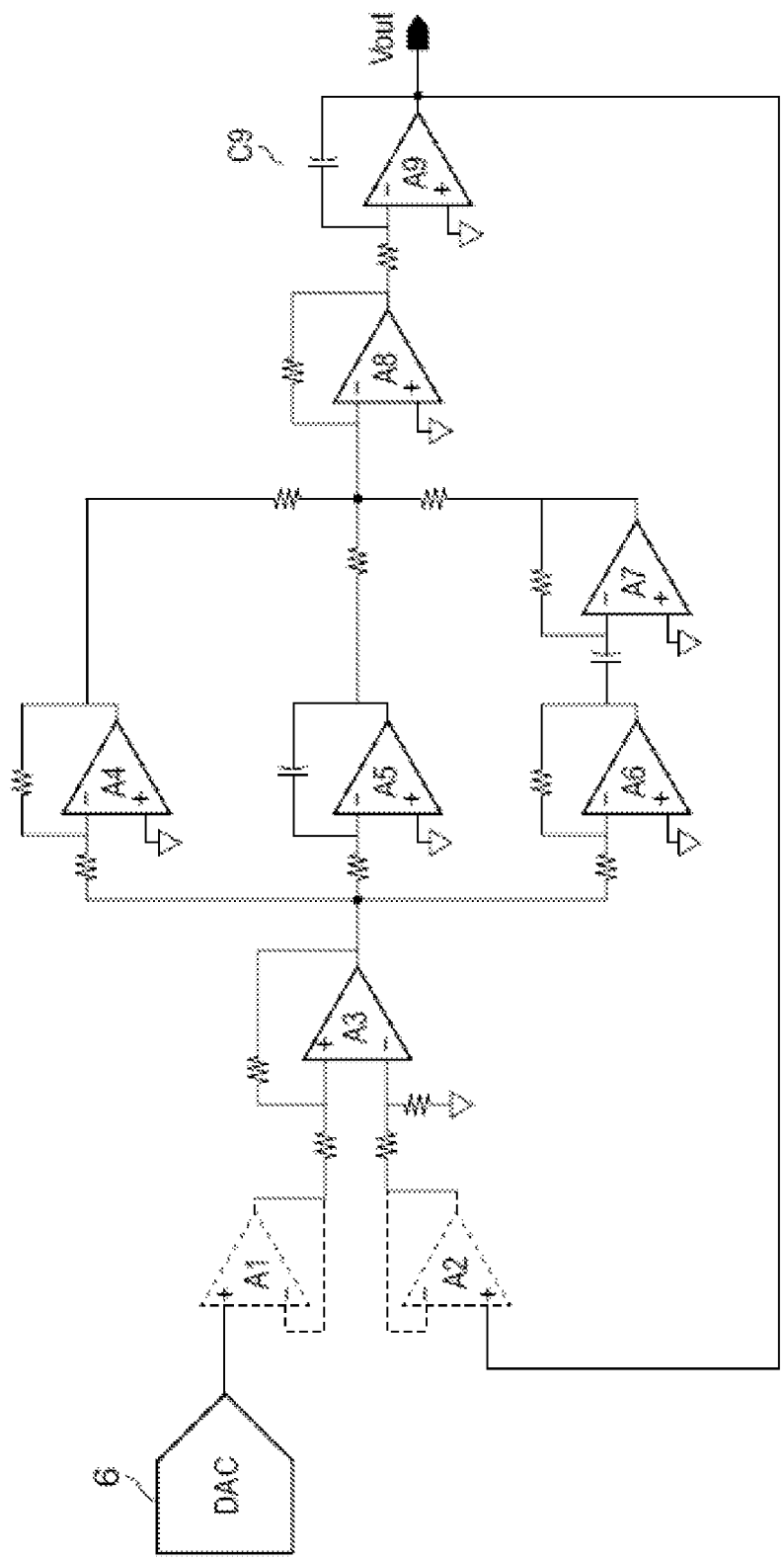
FIG. 10 is a circuit diagram of a further embodiment of a buffer.

In a further variation as shown in FIG. 10, the DAC buffer may be implemented to enable control of the transient response of DAC transition at the output, Vout, as follows. A first amplifier, or buffer, A1 optionally buffers the DAC output signal as it is coupled to the difference and scaling circuitry of amplifier A3. Alternatively the DAC can be directly connected to one of the inputs of amplifier A3. Similarly, the amplifier A2 optionally buffers the output signal Vout as it is coupled to the difference and scaling circuitry of amplifier A3. Alternatively the feedback signal can be directly provided to amplifier A3, Amplifiers A4, A5 and A7 perform proportional(P), integral(I) and derivative (D) functions respectively with amplifier A6 used to invert the signal polarity in this single-ended embodiment. The output signals of amplifiers A4, A5 and A7 are summed, inverted and scaled via amplifier A8 before output integration function achieved by A9.

In a differential embodiment, the A6 signal inversion function may be achieved by swapping or crossing over the differential signals, thereby avoiding need for an amplifier A6 in this case. Furthermore, in a differential embodiment, the A8 buffer, A8 feedback impedance and the input impedance to amplifier A9 can be removed and the inversion function can be achieved by inverting the differential signal path. In differential embodiment, the summation and scaling of A4, A5 and A7 signals is via respective input impedance to integrator A9. The integrator A9 can be adjusted by controlling the value of the capacitance C9 provided as a feedback element around it.

The PID control of FIG. 10 may also be varied statically or dynamically by varying the gain network impedances using existing and future digital potentiometer or capacitor DAC solutions to achieve or approximate a target transient response e.g. by use of switched capacitors as shown in FIG. 9 e.g. items 230.1 to 230.n.

The impedance choices are set by power, noise and precision constraints and targets, known to those skilled in the art.

It is thus possible to provide a dynamically configurable digitally controlled discrete time output buffer.

Although the teachings presented here have been made with respect to single-ended buffers and single-ended DACs for simplicity, the person skilled in the art will be aware of differential (dual ended) DACs and buffers. The teachings of this disclosure apply equally to such dual ended systems and circuits.

Similarly, the negative reference level has been described as zero volts both as a common single-ended solution preferred embodiment and to simplify the explanation.

All of the embodiments described herein are suitable for implementation within integrated circuits.

The teachings presented so far in respect of modifying the characteristics of a signal chain amplifier to tailor the overall response of a signal chain may be used in conjunction with relatively simple digital systems that may be provided intermediate the controller 4 or 4' and the DAC 6 or 6' to further modify the evolution of the signals within the signal chain without placing further computational burden on the controller or requiring the update rate of the controller to be increased.

A transition controller or an update engine (these terms are used interchangeably herein) may be arranged to receive data values from the controller and to process the transition from one DAC value to another by adding intermediate values.

This differs from interpolation as used in interpolating DACs. An interpolating DAC is not intended to modify the signal provided to it. Interpolation is used to increase the sample rate such that the Nyquist frequency is moved further away from the frequency band of the signal being converted. This simplifies the design of the reconstruction filter, but is not intended to modify the shape of the signal as it transitions between values.

In accordance with the teachings of the present disclosure the task of generating intermediate values is removed from the system providing the target value, and is brought on board the DAC. An update engine is provided as part of, and preferably embedded in, the DAC. The update engine, which can also be regarded as a transition controller can be provided as a state machine having reference to a library of one or more predefined update sequences or user configurable options. This simplifies the computational requirements for computer systems and the like providing target values to the controlled system and also means that some level of autonomy, power control or performance checking may be embedded within the digital to analog controller to enable it to provide improved performance or improves safety/robustness. This controller may therefore provide sub-sampling, or compressive sampling, DAC system capability. The transition controller can implement a sequence of step sizes that do not vary monotonically and which are more than just an interpolation of the input sequence.

Figure 11:
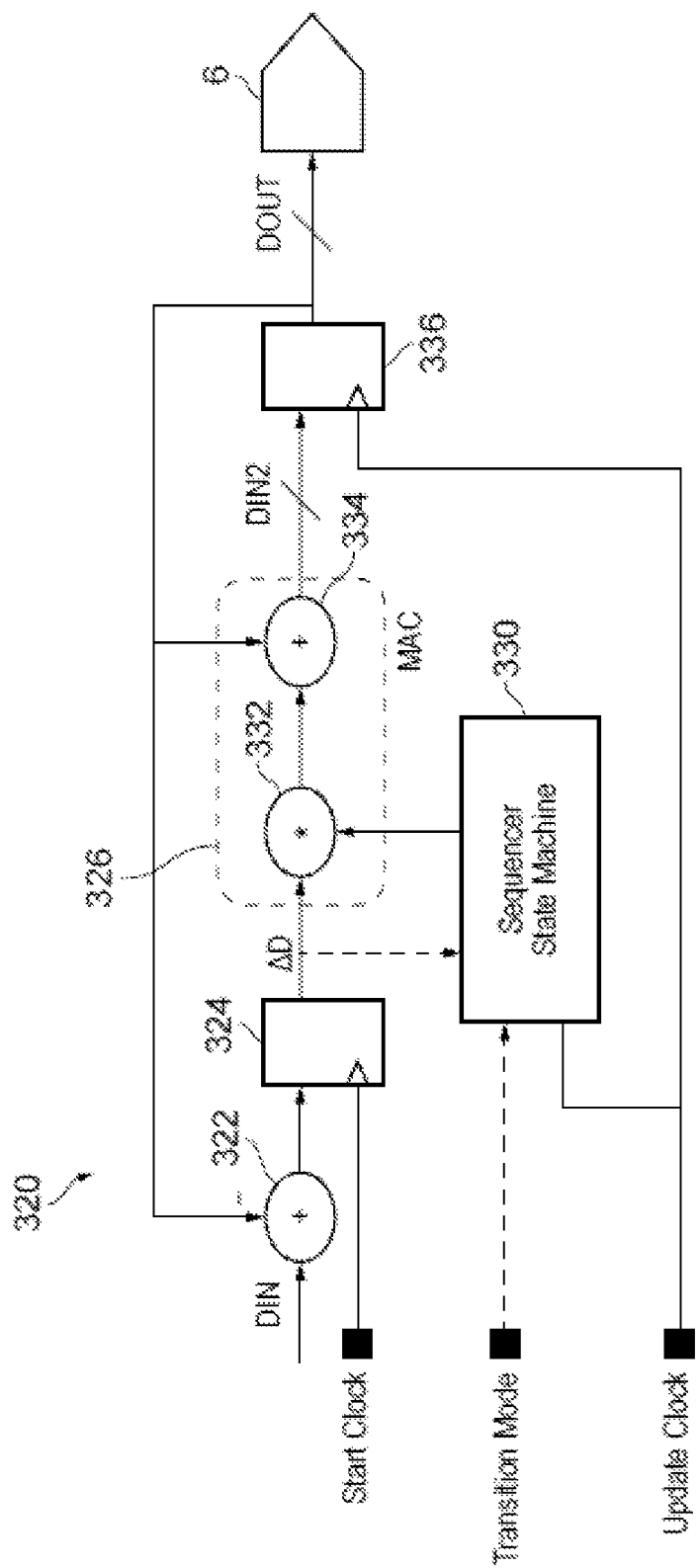
FIG. 11 is a circuit diagram of a modified DAC including a transition controller.

FIG. 11 is a schematic diagram of a transition controller provided in combination with a DAC. As shown in FIG. 11 the transition controller, generally designated 320, comprises a digital subtractor 322 for forming a difference between a new target value "DIN" and the preceding digital value "DOUT" (corresponding to a preceding value of DIN, i.e. DIN_OLD) provided to the DAC 6. The (digital) subtractor 322 forms a word representing the difference between DIN and DOUT (i.e between DIN and DIN_OLD) and this is latched into a register 324. Consequently the register provides a value "ΔD" representative of the size and direction of the transition that needs to be processed. The value ΔD could be held unchanged from one DAC update to another, i.e. from one value of DIN to another value to DIN. The value ΔD is provided to a first input of an arithmetic unit 326 which is operable to perform multiply and accumulate instructions. The arithmetic unit 326 may also include a register (not shown) to record the value of DOUT prior to the update sequence being performed and to store that value.

The update engine also includes a state machine sequencer 330 (sometimes referred herein simply as state machine) which controls the shape of the transition in response to a transition mode input signal. Effectively the state machine sequencer 330 includes one or more maps or libraries of normalized functions, where the values range between 0 and 100% of the DAC resolution (e.g. between 0 and 255 for an 8 bit DAC, between 0 and 4095 for a 12 bit DAC and so on) as a function of time, which are successively applied to the value ΔD by way of a multiplier 332 and then sequentially added to the value DOUT as stored in the previous output register 336 by a summer/adder 334. Thus a sequence of intermediate words describing the transition between DOUT and new DIN can be output as DIN2 and successively clocked into a further (output) register 336 and then provided to the DAC 6 to generate the modified transition in voltage between old DOUT and a new DOUT. The update clock runs at a higher rate that the DIN update rate. In this example the library of normalized functions contains the change from one intermediate value to the next and so on until the final value is reached.

Figure 12:
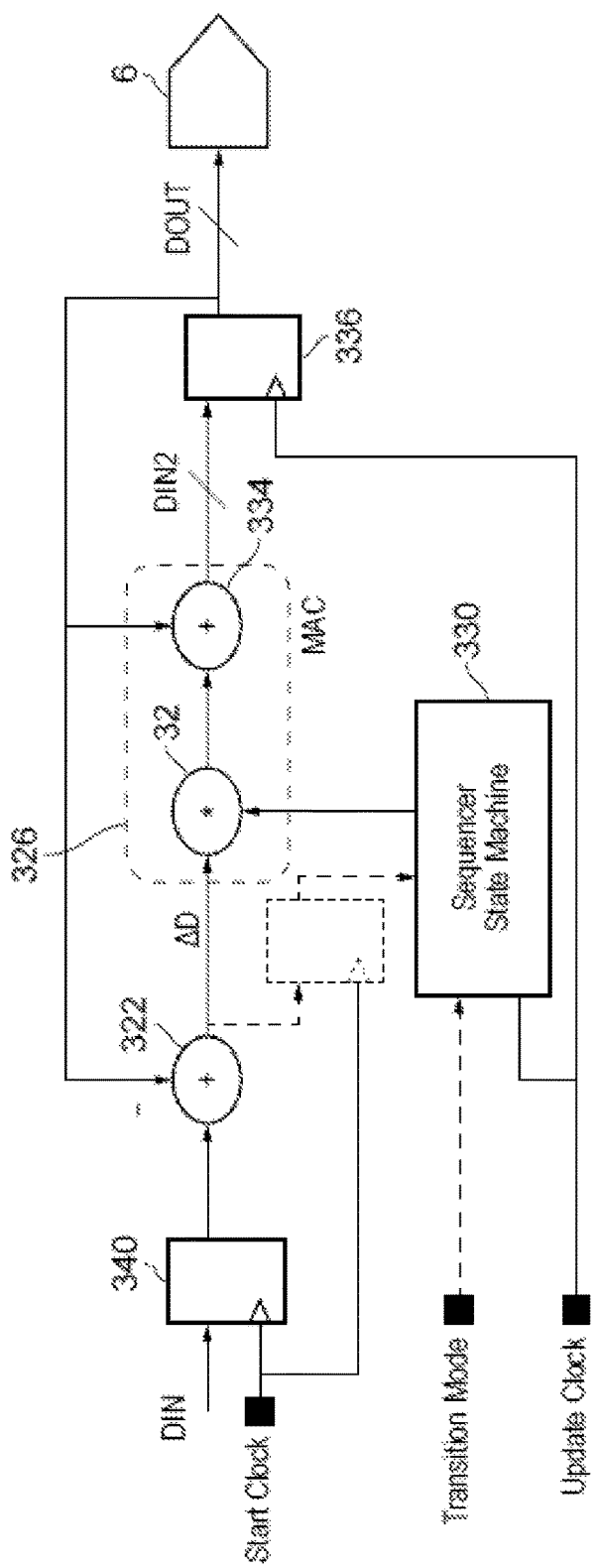
FIG. 12 is a circuit diagram of a modified transition controller.

FIG. 12 shows an alternative embodiment where the update sequence acts in a closed loop manner and consequently the new value DIN is recorded by a register 340 placed upstream of the (digital) subtractor 322, and the register 324 of FIG. 11 can be dispensed with.

The state machine sequencer 330 may be arranged to provide the clock to the (output) register 336 thereby giving the state machine sequencer 330 control over the update rate at the (output) register 336. That said, a similar effect could be obtained by holding the multiplication coefficient provided to the multiplier 332 static for several cycles of the update clock prior to changing it. The multiplication coefficient can be set to zero to stop summer/adder 334 modifying the output word at each DAC update clock transition.

The update sequencer of the state machine sequencer 330 may have access to a predetermined library of update profiles. These may also be delivered over a communications link, which may include a specific sequence of input words to the DAC 6 to cause it to modify its operation such that in interprets the words as digital programming instructions and not as words to be converted to an analog value. The delivery of the specific sequence of values may be preceded by a specific event, such as a reset signal, for the programming and/or update mode to be entered. For the purposes of transition frequency content spreading the DAC update sequencer or the DAC itself may also include a pseudorandom generator which is able to add a pseudorandom variation to the predetermined update sequences so as to modify the amount of noise or possibly shape the amount of noise in the DAC output, or vary the spectral content of the signal output (including noise) by the DAC 6.

Figure 13A:
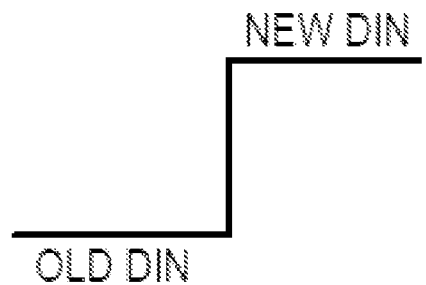
FIG. 13A-D show an initial step transition resulting from a code change supplied to a DAC, and variations of the transition applied as a result of operation of the transition controller embedded in the DAC.
Figure 13B:
Figure 13C:
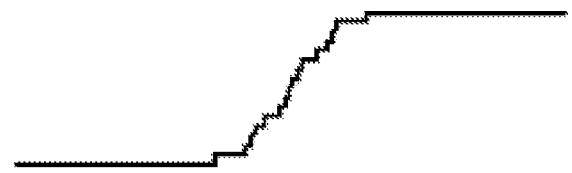

FIGS. 13A-D show exemplary, but not limiting, modifications which may be applied to a step change signal which is expected to transition from a first value, corresponding to old DIN to a new value, corresponding to new DIN. As shown in FIG. 13B a first modification might be to spread the transition out over a predetermined number of steps and over a predetermined time in a linear manner, thereby creating a ramp like approximation to the transition. As shown in FIG. 13C the transition might include a combination of ramp portions and plateau or pseudo-static portions. This effectively provides a way of replicating certain drive signals but without having to burden the system providing the target value T from having to calculate those values.

Figure 13D:
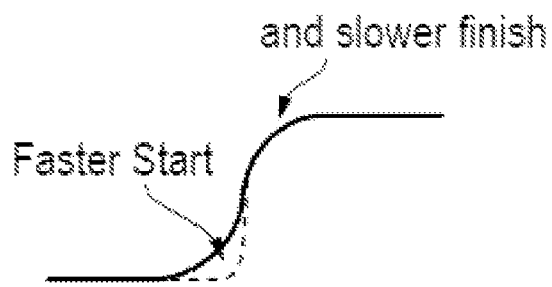

A further option, as shown in FIG. 13D, is to smooth either the start or end portions, or both, of the transition thereby giving it an "S" like shape again in order to modify the frequency content of the transition. It may be preferred for higher frequency content to be in the earlier part of transition and lower frequency content to be towards the end of the transition.

It can thus be seen that the provision of a transition sequencer 320 as part of the DAC can provide enhanced flexibility without burdening the control system driving the DAC. Furthermore, in some variations the transition sequence may be described in a parameterized form for example as a second order differential equation describing a mechanical resonance system and parameters describing the resonant system may be loaded into the transition sequencer such that it can adapt the step size and update rate to control (for example by monitoring the perturbations in the voltage or current at the output of the buffer by way of an embedded analog to digital converter), and preferably minimize resonant behavior in the driven system thereby reducing the computational task required of the controller 22 thereby providing a further simplification of systems controlling the DAC. It is thus possible to provide a transition of a few to tens of intermediate steps with a minimal additional hardware overhead.

Figure 14:
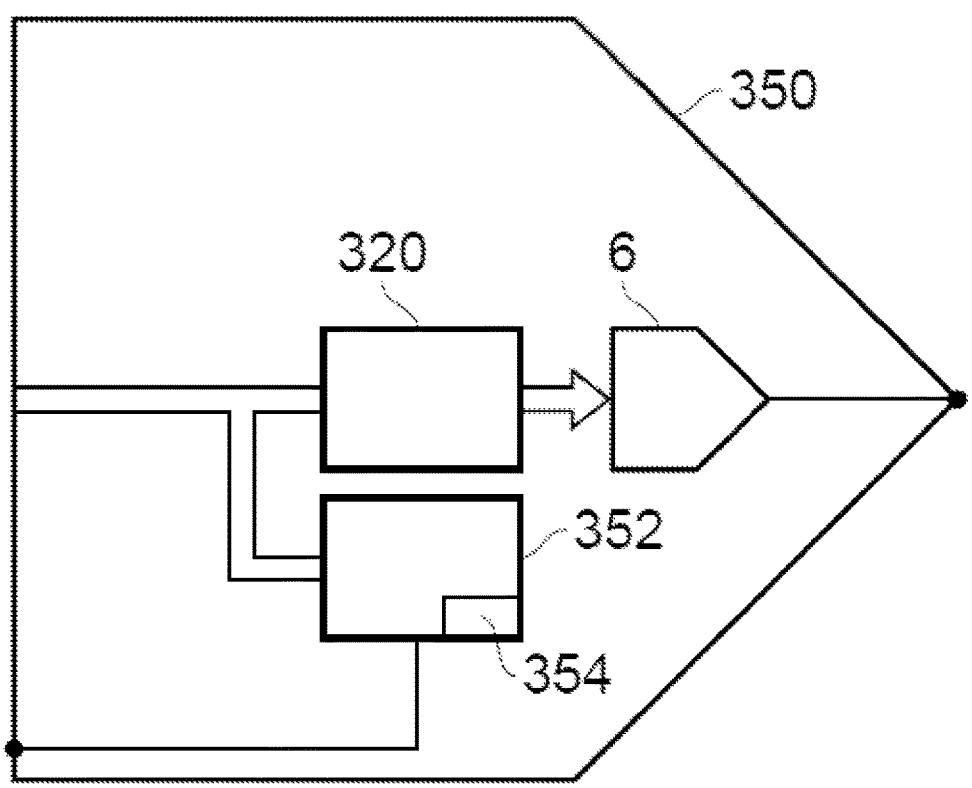
FIG. 14 schematically illustrates a further embodiment of a DAC in accordance with the teachings of this disclosure.

As shown in FIG. 14, DAC 350 may further include a health check function 352 as well as the update engine 320. This enables higher level checking functions to be implemented within the DAC. The update engine 320 can be used to tune the dynamics of the controlled system, for example by modifying a transition to reduce ringing in a controlled system. However this does not prevent a system error, such as a failed sensor or a fault in a data processor or an error in a program being executed on the data processor, from providing instructions which may be wrong or at least suspect. For example, in the auto-focus camera example, it is highly unlikely that a properly functioning system would seek to move the lens by large displacements over a prolonged period of time. Consequently a simple rule looking for a sequence of changes greater than a predetermined magnitude for a predetermined period of time may be indicative of a fault being diagnosed. Such a sequence could be detected by summing a magnitude of word changes, for example by summing the magnitude of ΔD over a predetermined period, as may be set by a register value, and setting an error flag if a threshold is exceeded.

Similarly, if a value remains static for longer than expected or desirable an error message may be sent to the control system.

If a response to an error message is not received, thereby providing confidence that a control system providing input words to the DAC is still operating correctly, then the DAC may be programmed with authority to implement a remedial action. This may, for example, include driving the output to a predetermined value set by the system designer as a default. Alternatively the DAC may include an embedded processor or configurable logic unit (be that by software or register settings) in association with or as part of the health check system that enables the DAC to implement a back-up control strategy and possibly seek data from another source. This may be possible if, for example, the DAC has access to a bus, such as a serial data bus, from where it could monitor data messages that had been destined for the controller that drives the DAC. The DAC may be enabled to perform remedial action without having sent an error message.

More complex signal analysis may also be performed. A signal analysis section may be provided in combination with the state machine, as shown in FIG. 14, which may execute a program to learn the nature of the signals being used to drive the DAC. Such analysis may include statistical analysis checking for frequency and magnitude checking. Thus unexpectedly large or small runs of signal magnitude may be flagged as being statistically unlikely and a flag may be set or message sent to the control system to notify it that the DAC is concerned about the control sequence, and is asking "are you sure?". Patterns or signatures in the data may also be learnt or estimated by applying analysis techniques such as Fourier analysis, wavelet analysis, Hadamard transform and so on, thereby enabling the DAC to adapt to use patterns.

It is this possible to provide one or more of 1) input signal checking, 2) system dynamics tuning and 3) signal transition modification as additional functionality within a DAC system without loading these tasks onto hardware outside of the boundary of the DAC. In other words these additional functions appear to be "free" to the user because they are provided as part of the DAC 50 and do not require additional hardware outside of the DAC offering to be provided.

The transition controller may have access to a sensor input so as to observe the transition that was output or the system response that occurred as a result of the transition sequence provided by the transition controller. The controller may include an update engine for comparing the observed response with a desired response and modifying the update sequence. Thus the size of the update may be modified or the time between the intermediate values being applied may be varied. This is relevant to compensating for the resonant frequency of a driven mechanical system.

The claims presented here are in single dependency format suitable for filing at the USPTO. However it is to be understood that any claim is capable of depending on any preceding claim unless that is clearly infeasible.

What is claimed is:

1. A buffer with a dynamically adjustable response, the buffer comprising:
   first and second inputs;
   an input stage for storing a charge representative of a voltage difference between the first and second inputs of the buffer;
   an output stage; and
   a discrete time signal processing system to adjust a dynamic signal response characteristic of the buffer by varying a controllable component associated with the buffer.

2. The buffer according to claim 1, wherein an internal gain of the buffer is adjustable.

3. The buffer according to claim 1,
   wherein the input stage of the buffer comprises a sampling capacitor, and the first and second inputs are presented across the sampling capacitor.

4. The buffer according to claim 1, wherein the input stage of the buffer comprises a plurality of capacitors in a switched array.

5. The buffer according to claim 1, further comprising a switch circuit for charge sharing from the input stage with a capacitor in the output stage.

6. The buffer according to claim 5, wherein at least one of the following apply:
   a) the output stage of the buffer is coupled to an integrator; and
   b) the capacitor in the output stage is provided in a feedback loop around an operational amplifier.

7. The buffer according to claim 1, wherein a gain of the buffer is adjustable by varying relative values of a charge sharing capacitance and a capacitance of the output stage, and at least one of the charge sharing capacitance and the capacitance of the output stage is adjustable in response to a control signal.

8. A system having a controllable transient response, the system comprising:
   a digital to analog converter (DAC); and
   a buffer having an adjustable dynamic response characteristic, the buffer comprising:
   an input stage receiving an output of the DAC;
   an output stage; and
   a discrete time signal processing system to vary a controllable component associated with the buffer so as to modify a transition profile between a first output voltage and a second output voltage of the output stage.

9. The system of claim 8, wherein:
   the input stage of the buffer stores a charge representative of a voltage difference between first and second inputs of the buffer;
   the input stage comprises a plurality of capacitors in a switched array; and
   an amount of charge transferred between the input stage of the buffer and a capacitor of the output stage of the buffer is adjustable so as to modify a response of the buffer.

10. The system of claim 1, further comprising at least one charge transfer element, wherein a number or size of the at least one charge transfer element is adjustable in response to a control signal.

11. The system according to claim 8, wherein:
    the DAC comprises a switched capacitor array, and the switched capacitor array functions as the input stage of the buffer.

12. The system according to claim 8, wherein an internal gain or internal small signal bandwidth of the buffer is modified in response to a change or predicted change in an input supplied to the DAC so as to modify the transition profile between the first output voltage and the second output voltage.

13. The system according to claim 12, wherein the change is predicted based on one or more of the following: pattern analysis, trend analysis, analytical analysis, and statistical analysis.

14. The system according to claim 8, further comprising:
    a controller responsive to an input word supplied to the DAC and is arranged to adjust a gain within the discrete time signal processing system implemented in a signal path feeding a signal to the output stage of the buffer, wherein the discrete time signal processing system comprises at least one comparator and switches associated with at least one capacitor for controlling connections to at least one capacitor, said at least one capacitor for storing a charge representative of the input word and for transferring the charge, in whole or in part, to an integrator formed at the output stage.

15. The system according to claim 8, wherein a response of the buffer is dynamically adjustable by controlling a capacitance or a resistance associated with the buffer.

16. The system according to claim 8, wherein the system forms an integrated circuit.

17. A method of modifying a voltage transition from a first value to a second value at an output of a buffer, the method comprising modifying values of capacitors within the buffer to give a faster rate of change at a beginning of the voltage transition compared to an end of the voltage transition, wherein parameters of the buffer are controlled by the capacitors within the buffer and the values of the capacitors are digitally adjustable so as provide a desired transient response.

18. The method according to claim 17, further comprising modifying the values of the capacitors to modify frequency content of the voltage transition.

19. The method according to claim 17, further comprising modifying an internal gain of the buffer at a constant rate.

20. The method according to claim 17, further comprising modifying an internal gain of the buffer at a changing rate so as to make the voltage transition happen more quickly at an initial phase of the voltage transition and more slowly towards an end of the voltage transition.

21. A method of adjusting a transient response of a buffer in combination with a digital to analog converter (DAC), the method comprising:
   receiving an output from the DAC by an input stage of the buffer;
   outputting a signal at an output stage of the buffer, the output stage driving a controlled device; and
   digitally varying a controllable component associated with the buffer to modify a rate of voltage transition from a first value to a second value at an output of the output stage.

22. The method according to claim 21, wherein digitally varying the controllable component comprises digitally adjusting values of capacitors within the buffer.

23. The method according to claim 21, wherein digitally varying the controllable component comprises adjusting a gain of the buffer by varying relative values of a capacitance of the input stage and a capacitance in the output stage.

24. The method according to claim 21, wherein digitally varying the controllable component comprises adjusting an internal gain or internal small signal bandwidth of the buffer in response to a change or predicted change in an input supplied to the DAC.

* * * * *